United States Patent [19]
Oltmann

[11] Patent Number: 4,757,192
[45] Date of Patent: Jul. 12, 1988

[54] EXTENDED DYNAMIC RANGE OPTICAL RECEIVER AND SIGNAL AMPLIFIER APPARATUS

[75] Inventor: Christian W. Oltmann, Allen, Tex.

[73] Assignee: Rockwell International Corporation, El Segundo, Calif.

[21] Appl. No.: 54,641

[22] Filed: May 27, 1987

[51] Int. Cl.$^4$ .............................................. H01J 40/14
[52] U.S. Cl. ............................. 250/214 AG; 330/282
[58] Field of Search .................... 250/214 AG, 214 R; 307/311; 330/59, 86, 282, 308

[56] References Cited

U.S. PATENT DOCUMENTS

| | | | |
|---|---|---|---|
| 4,069,461 | 1/1978 | Sano | 330/282 |
| 4,529,947 | 7/1985 | Biard et al. | 330/308 |
| 4,642,453 | 2/1987 | Nordqvist et al. | 330/59 |

Primary Examiner—David C. Nelms
Assistant Examiner—Stephone B. Allen
Attorney, Agent, or Firm—Bruce C. Lutz; V. L. Sewell; H. Fredrick Hamann

[57] ABSTRACT

A very wide bandwidth, wide dynamic range amplifier incorporating a plurality of feedback paths which are parallel connected upon command is illustrated. The parallel connection is actuated from an input signal strength sensor which has built-in hysteresis so that there is no continuous switching from one feedback configuration to the other at a given input signal strength. The design of the switch feedback path is such that there is very low capacitance at the input of the amplifier, and a single signal peaking compensation circuit can be used to prevent undesirable signal peaking in the response curve.

5 Claims, 1 Drawing Sheet

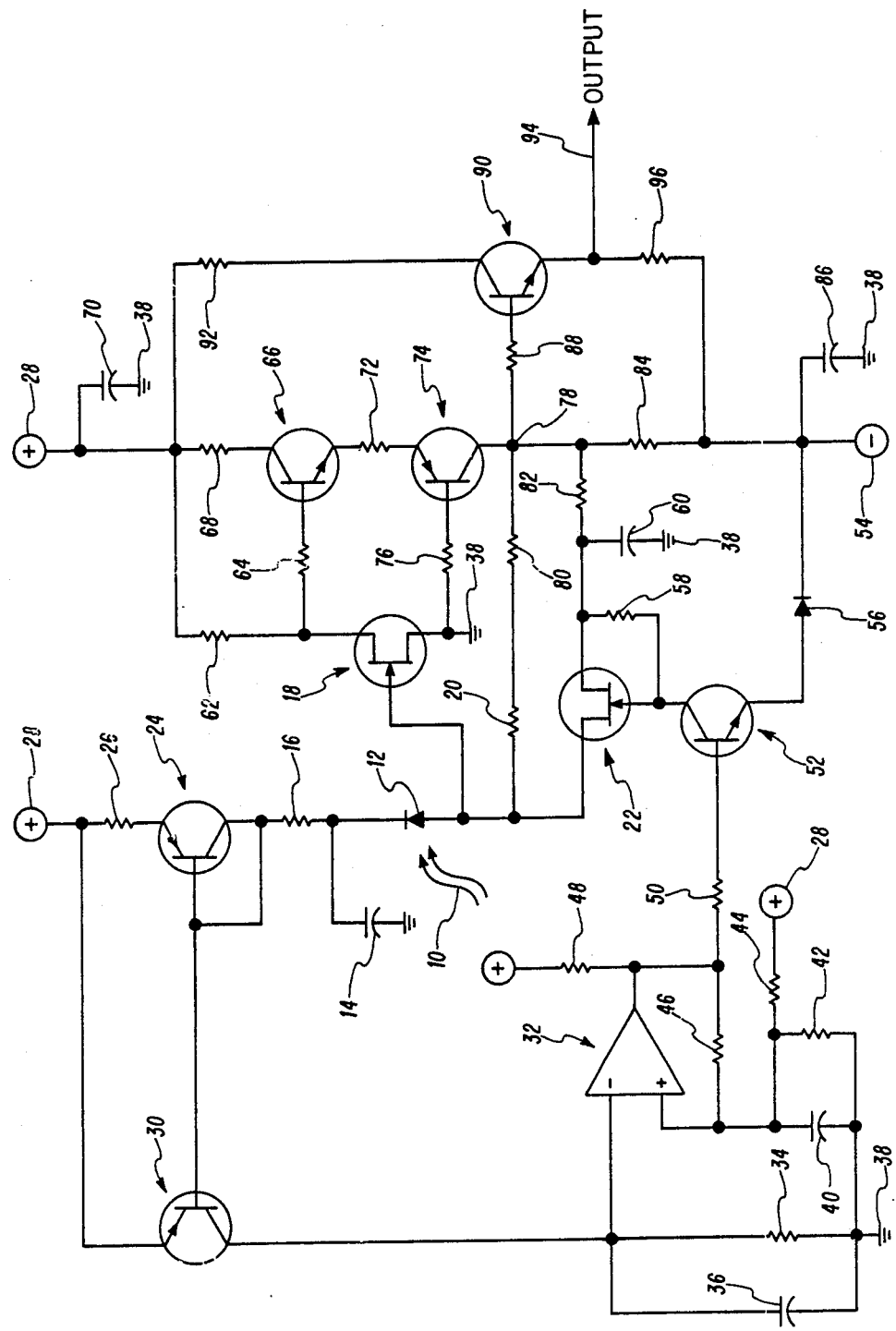

EXTENDED DYNAMIC RANGE OPTICAL RECEIVER AND SIGNAL AMPLIFIER APPARATUS

THE INVENTION

The present invention is generally concerned with electronics, and more specifically, with an amplifier circuit having a wide dynamic range. Even more specifically, the invention is concerned with a trans impedance receiver amplifier incorporating automatic gain control over a wide dynamic range and which achieves its capabilities by activating an additional feedback loop only when a sensor circuit determines that the input signal has exceeded a predetermined level.

BACKGROUND

The present circuit finds one use in a situation where signals are being converted from lightwave signals being carried over fiber optic cables to electronic signals for transfer over metallic transmission media. Thus, the signal amplitude does not vary significantly for any particular physical location. However, each particular physical location may have a greatly varied gain requirement from other applications of the amplifier. Thus, the typical prior art approach was to install an amplifier and adjustable optical attenuator and adjust the attenuator while using test equipment to measure the output signal at a given load point. The present invention eliminates the need for the test equipment and the need for providing the adjustment. Further, since the device has such a wide dynamic range, the present invention eliminates the need for further adjustment as aging of the components occurs.

Prior art attempts to advantageously control the dynamic range of an AGC amplifier, for a use such as outlined above, have proceeded along the lines of placing a variable impedance such as a controlled FET in parallel with the feedback resistor of the AGC amplifier. A problem with this approach is that for each variable impedance setting, a different transfer characteristic compensating set of impedance values should be provided. Typically, some compromise value is used which provides less than desirable transfer characteristic results for most values of input signal amplitude.

The present invention is operating in one embodiment at a frequency in the neighborhood of 100 MHz. When amplifiers operate at these frequencies, they are very sensitive to stray capacitance. If the switch used to connect the additional one or more feedback networks in parallel with the main feedback network is connected to the output of the amplifier as opposed to the input, or is not in and of itself a very low capacitance switch, the circuit will not work. People in the industry have been attempting to accomplish the effect of the present invention by various similar embodiments for a number of years, and the present embodiment is the first to succeed.

Another problem in the prior art approaches is that if a signal sensor is used to switch the amplifier between gain adjustments and it is based on a single input signal amplitude, a switching back and forth in a communications environment can cause considerable data disruption. Thus, it is essential that there be some type of hysteresis between the input signal values at which switching of the feedback circuit, in and out of operation, occurs.

It is also essential to reliability and accuracy of signal transmission that the switching be accomplished in some minimal time such as 300 ms.

It is thus an object of the present invention to overcome various deficiencies of prior art designs and to conform to customer requirements in electrical specifications of a communications type trans impedance amplifier.

Other objects and advantages of the present invention will be apparent from a reading of the specification and appended claims in conjunction with the single drawing, which comprises a circuit diagram of a preferred embodiment of the invention.

DETAILED DESCRIPTION

In the drawing, a wavy type double arrow is designated as 10 and represents a lightwave input signal supplied to an optical diode 12. Optical diode 12 is connected at one end to a capacitor 14 and to a resistor 16 and is connected at the other end to a gate input of an FET transistor generally designated as 18. The gate of FET 18 is also connected to one end of a resistor 20 and a drain lead of an FET transistor generally designated as 22. A PNP transistor generally designated as 24 and connected to operate substantially as a diode, has both its base and collector connected to the other end of resistor 16. Its emitter is connected to a resistor 26 whose other end is connected to a positive power potential 28. Potential 28 is also connected to an emitter of a PNP transistor generally designated as 30, having its base connected to the base of transistor 24 and its collector connected to an inverting input of an amplifier 32. A resistor 34 and a capacitor 36 are connected in parallel between the inverting input of amplifier 32 and ground or reference potential 38. A capacitor 40 is connected between ground 38 and the non-inverting input of amplifier 32. A resistor 42 is connected in parallel with capacitor 40. A resistor 44 is connected between the non-inverting input of amplifier 32 and the positive power potential 28. A feedback resistor 46 is connected from an output of amplifier 32 to the positive or non-inverting input of amplifier 32 in a positive feedback mode to provide a hysteresis effect in the switching of its load. A resistor 48 is connected between the positive power potential and the output of amplifier 32. A resistor 50 is connected between the output of amplifier 32 and a base of an NPN transistor generally designated as 52 and having its collector connected to a gate of the FET 22. The emitter of transistor 52 is connected to a negative power terminal 54 through a diode 56. A bias resistor 58 is connected from the source of FET 22 to the gate as shown. A capacitor 60 is connected from the source of transistor 22 to ground 38. The drain of transistor 18 is connected through a resistor 62 to positive power potential 28. The drain of transistor 18 is also connected through a resistor 64 to a base of an NPN transistor generally designated as 66 and having its collector connected through a resistor 68 to positive potential 28. A capacitor 70 is connected between positive power potential 28 and ground 38. The emitter of transistor 66 is connected through a resistor 72 to an emitter of a PNP transistor generally designated as 74. Transistor 74 has its base connected through a resistor 76 to ground 38. The FET 18 has its source connected to ground 38 also. A collector of transistor 74 is connected to a junction point 78. A resistor 80 is connected between junction point 78 and the other end of resistor 20. A resistor 82 is connected between junction point 78 and the source of transistor 22. A further resistor 84 is connected between junction point 78 and negative power potential 54. A capacitor 86 is connected between negative power potential 54 and ground 38. A resistor 88 is connected between junction point 78 and a base of an NPN transistor generally designated as 90 having its collector connected through a resistor 92 to positive power potential 28. An emitter of transistor 90 is connected to an output terminal generally designated as 94. A resistor 96 is connected between output terminal 94 and negative terminal 54.

OPERATION

In the drawing, the transistors 18, 66, and 74, constitute the amplifying transistors for the automatic gain control amplifier. An additional stage of buffering is provided by transistor 90. The input signal comprises a modulated lightwave which affects the internal impedance of photodiode 12. The feedback around the main amplifier comprises two paths. One path is the pair of resistors 80 and 20, while the second feedback path, which is the switched feedback path, comprises the switch 22 and the transfer characteristic compensation network of resistor 82 and capacitor 60. The circuitry comprising the transistor 24 and transistor 30 is a mirror type signal detection circuit for measuring the current being passed from power supply 28 through diode 12 to terminal 54 and which current produces the signals to be amplified. Typically, the transistor 24 and transistor 30 are contained in the same package and thus, are at the same temperature and are theoretically of the exact same characteristics since they are made at the same time and of the same materials. By having the transistor 30 in combination with resistor 34, a voltage offset can be provided which is used in conjunction with a voltage supplied to the non-inverting input of amplifier 32 from the voltage dividing network comprising resistors 42 and 44. In other words, transistor 30 converts the current indication to a voltage so that the amplifier 32 will turn transistor 52 to an OFF condition when the sensed current rises above a given value. When transistor 52 is turned OFF, a bias is applied through resistor 58 whereby FET 22 turns fully ON. Transistor 22, for one embodiment of the invention, was a special low capacitance FET transistor having Part No. NE72000 and manufactured by NEC. At frequencies lower than 100 megahertz, the characteristics of this transistor switch would be less critical. If the value of the current flow through diode 12 dropped significantly, the transistor 52 would be turned ON and the portion of the feedback circuit including 82 would be removed from having any effect on circuit operation since transistor 22 would be turned OFF.

As previously mentioned, the typical prior art approach was to install an amplifier and optical attenuator and adjust the attenuator while measuring the output signal at a given load point. The present invention eliminates the need for the test equipment and the need for providing any adjustment including later adjustments for aging of components.

Typically, the only time switching in the feedback loop occurs, is when the equipment is first turned ON. At this time the circuit determines the amount of current flow through diode 12 and adjusts the gain of the amplifier accordingly through the insertion of the feedback network utilizing resistor 82 if the current in pin diode 12 is high enough to require same.

Thus, in summary, the present invention comprises a wide dynamic range amplifier which has two feedback circuits, one of which includes a low capacitance switch and a transfer characteristic compensating network as part of the feedback loop to lower the gain of the amplifier when the switch is in an ON condition. As illustrated, the switching is accomplished by a current sensing circuit having built-in hysteresis such that any possibility of intermittent switching, due to small variations in current from temperature, aging, etc., is eliminated.

Thus, I wish to be limited not by the specific embodiment shown but only by the scope of the appended claims wherein I claim:

1. Wide dynamic range automatic gain control amplifier apparatus comprising, in combination:
   amplifier circuit means including input and output means;
   first feedback means continuously connected from said output means to said input means of said amplifier circuit means; and
   second feedback means, comprising transfer function signal compensating resistive-capacitive means and low capacitance feedthrough switch means serially connected between said output means and said input means of said amplifier circuit means with said switch means connected to said input means of said amplifier means, the activation of said switch means operating to lower the overall gain of said automatic gain control amplifier apparatus by adding to the feedback current supplied by said first feedback means.

2. Optical signal receiver and signal amplifier comprising, in combination:
   optical diode means for converting received optical signal to electrical currents;
   amplifier means, including input and output, connected to said optical diode means for receiving electrical current signals therefrom to be amplified;
   first negative signal feedback continuously connected from said output to said input of said amplifier means;
   second negative signal feedback, connected in parallel with said first negative signal feedback and including a low feedthrough capacitance switch at the amplifier means input portion of said second negative signal feedback for combining the effects of said first and second feedbacks; and
   current mirror and signal hysteresis means, connected between said optical diode means and said low feedthrough capacitance switch for activating said switch only when the current level in said optical diode means exceeds a predetermined value and for subsequently deactivating said switch only when the current level in said optical diode means is reduced to a given amount below said predetermined value.

3. Optical signal receiver and signal amplifier comprising, in combination:
   optical diode means for converting received optical signal to electrical currents;
   amplifier means, including input and output, connected to said optical diode means for receiving electrical current signals therefrom to be amplified;
   first negative signal feedback directly connected from said output to said input of said amplifier means;
   second negative signal feedback, connected in parallel with said first negative signal feedback and including switch means at the amplifier means input portion of said second negative signal feedback for controlling the addition of said second negative signal feedback to said first signal feedback; and current mirror and signal hysteresis means, connected between said optical diode means and said switch means for activating said switch means only when the current level in said optical diode means exceeds a predetermined value.

4. The method of providing wide dynamic range in a high frequency feedback amplifier for amplifying optical frequency signals received by an optical diode supplying an electrical representation of said optical signals to the amplifier comprising the steps of:

detecting the average current flow through said optical diode;

activating a second and supplemental feedback path around said feedback amplifier with a low capacitance switch connected to the input of said amplifier when the average current flow detected exceeds a first predetermined amount; and holding the second feedback path in an active condition until the average current flow reaches a second predetermined amount which amount is substantially less than said first predetermined amount.

5. Apparatus for providing wide dynamic range in a high frequency feedback amplifier for amplifying optical frequency signals received by an optical diode supplying an electrical representation of said optical signals to the amplifier comprising, in combination:

first means for providing feedback stabilized amplification of high frequency signals;

optical diode second means, connected to said first means, for detecting optical signals and translating same to electrical signals for application to said first means;

third means, connected to said first means, for detecting the average current flow through said optical diode supplemental means;

feedback fourth means, including a low capacitance switch connected to said input of said first means, for providing a second feedback path around said first means when said switch is activated;

detection fifth means, connected between said second and fourth means, for activating the switch of said fourth means when the average current flow detected exceeds a first predetermined amount; and sixth means, comprising a part of said fifth means, for holding the second feedback path in an active condition until the average current flow reaches a second predetermined amount which amount is less than said first predetermined amount.

* * * * *